(12) United States Patent
Kurokawa et al.

(10) Patent No.: US 10,975,272 B2
(45) Date of Patent: Apr. 13, 2021

(54) HOT MELT COMPOSITION, HOT MELT COMPOSITION PRODUCTION METHOD, SEAL MATERIAL, ELECTRONIC DEVICE, AND LAMP

(71) Applicant: MORESCO CORPORATION, Kobe (JP)

(72) Inventors: Hiroshi Kurokawa, Kobe (JP); Katsuhito Fukuda, Kobe (JP)

(73) Assignee: MORESCO CORPORATION, Hyogo (JP)

( * ) Notice: Subject to any disclaimer, the term of this patent is extended or adjusted under 35 U.S.C. 154(b) by 432 days.

(21) Appl. No.: 15/780,776

(22) PCT Filed: Nov. 18, 2016

(86) PCT No.: PCT/JP2016/084228
§ 371 (c)(1),
(2) Date: Jun. 1, 2018

(87) PCT Pub. No.: WO2017/098889
PCT Pub. Date: Jun. 15, 2017

(65) Prior Publication Data
US 2020/0248048 A1 Aug. 6, 2020

(30) Foreign Application Priority Data
Dec. 7, 2015 (JP) .............................. JP2015-238140

(51) Int. Cl.
| | | |
|---|---|---|
| *C09J 125/08* | (2006.01) | |
| *C09J 11/06* | (2006.01) | |
| *C09K 3/10* | (2006.01) | |
| *F21S 45/50* | (2018.01) | |
| *F21V 31/00* | (2006.01) | |
| *H05K 5/06* | (2006.01) | |
| *F21V 15/01* | (2006.01) | |
| *H05K 5/03* | (2006.01) | |

(52) U.S. Cl.
CPC ............ *C09J 125/08* (2013.01); *C09J 11/06* (2013.01); *C09K 3/10* (2013.01); *F21V 31/005* (2013.01); *H05K 5/069* (2013.01); *C09K 2200/0642* (2013.01); *F21S 45/50* (2018.01); *F21V 15/01* (2013.01); *H05K 5/03* (2013.01)

(58) Field of Classification Search
CPC ........... C09J 125/08; C09J 11/06; C09K 3/10; C09K 2200/0642; F21V 31/005; H05K 5/069; F21S 45/50

USPC ......................................................... 524/576
See application file for complete search history.

(56) References Cited

U.S. PATENT DOCUMENTS

| | | | | | |
|---|---|---|---|---|---|
| 4,783,504 | A | * | 11/1988 | St. Clair | ............... C08F 287/00 524/270 |
| 5,994,474 | A | * | 11/1999 | Wey | ......................... C09J 11/06 525/288 |
| 6,200,002 | B1 | * | 3/2001 | Marshall | ........... G02F 1/133605 362/231 |
| 9,012,563 | B2 | * | 4/2015 | Yalvac | .................... C09J 151/06 524/570 |
| 2008/0139734 | A1 | | 6/2008 | Nakashima et al. | |
| 2008/0167421 | A1 | * | 7/2008 | Yalvac | .................. C08F 255/02 524/570 |
| 2009/0242123 | A1 | | 10/2009 | Zhang et al. | |
| 2011/0112250 | A1 | | 5/2011 | Esseghir et al. | |
| 2011/0214715 | A1 | | 9/2011 | Kahles et al. | |
| 2014/0187695 | A1 | | 7/2014 | Keuler et al. | |

FOREIGN PATENT DOCUMENTS

| | | |
|---|---|---|
| CN | 1177623 | 4/1998 |
| CN | 101580680 | 11/2009 |
| CN | 104520400 | 4/2015 |
| EP | 0 414 768 | 2/1994 |
| EP | 0 824 851 | 10/2000 |
| EP | 1 743 928 | 1/2007 |
| GB | 2 254 333 | 10/1992 |
| JP | 54-149741 | 11/1979 |
| JP | 55-160074 | 12/1980 |
| JP | 62-218468 | 9/1987 |
| JP | 3-504985 | 10/1991 |
| JP | 5-247422 | 9/1993 |
| JP | 6-192636 | 7/1994 |
| JP | 10-88096 | 4/1998 |
| JP | 10-251357 | 9/1998 |
| JP | 2001-288441 | 10/2001 |
| JP | 2001-525985 | 12/2001 |
| JP | 2009-500513 | 1/2009 |
| JP | 2010-248328 | 11/2010 |
| JP | 2011-518239 | 6/2011 |
| JP | 2011-526956 | 10/2011 |
| JP | 2013-119583 | 6/2013 |
| TW | 201144394 | 12/2011 |
| WO | 91/06580 | 5/1991 |
| WO | 2011/109605 | 9/2011 |

\* cited by examiner

*Primary Examiner* — Kelechi C Egwim
(74) *Attorney, Agent, or Firm* — Wenderoth, Lind & Ponack, L.L.P.

(57) ABSTRACT

One aspect of the present invention is a hot melt composition including a modified thermoplastic polymer having an alkoxysilyl group in a molecule; a softener; and a catalyst.

15 Claims, 2 Drawing Sheets

FIG.1

FIG.2 ated, cooling. The solidi-
HOT MELT COMPOSITION, HOT MELT COMPOSITION PRODUCTION METHOD, SEAL MATERIAL, ELECTRONIC DEVICE, AND LAMP

TECHNICAL FIELD

The present invention relates to a hot melt composition, a hot melt composition production method, a seal material, an electronic device, and a lamp.

BACKGROUND ART

The hot melt composition is melted by heating and can be applied to a desired place by coating or the like in a molten state thereof, and thereafter solidified by cooling. The solidified hot melt composition can exhibit various functions. For example, the hot melt composition can be used as a hot melt adhesive. Since the hot melt composition can be applied in a state melted by heating, there is no need to include a solvent, and when used as an adhesive, it can be served as a solventless adhesive.

Further, the hot melt composition can also be used as a seal material. The hot melt composition in a molten state is applied to a portion where a seal material is desired to be disposed by coating or the like, and then solidified to serve as a seal material. Therefore, unlike a seal material such as an O-ring or the like, there is no need to mold in advance. Thus, when the seal material is incorporated in the product, the seal material can be formed into a desired shape.

For these reasons, the hot melt composition is used in various fields, such as packaging fields (e.g. cardboard boxes and small boxes), sanitary item fields (e.g. paper diapers and sanitary goods), bookbinding fields, plywood fields, woodworking fields, automobile fields, home electronics fields, residential fields, and the like.

Also, various properties are required for the hot melt composition. For example, when used as a seal material, it is required that flexibility capable of maintaining the sealing function can be exhibited following the expansion, shrinkage, warp, etc. of the member to which the seal material is applied. In addition, the seal material is also required to have heat resistance. For example, when the hot melt composition is used as a seal material for an automobile member, high temperature resistance is required since it is extremely high in the engine room, in the cabin in the summer, and the like. Further, it is also required that the hot melt composition used as the seal material be capable of proper application.

As such a hot melt composition, those described in Patent Literatures 1 to 3 can be mentioned.

Patent Literature 1 discloses a thermoplastic elastomer composition including a hydrogenated block copolymer produced by hydrogenating a block copolymer including at least a polymer block consisting mainly of aromatic vinyl compound units and a copolymer block consisting mainly of conjugated diene units, the hydrogenated block copolymer having a weight average molecular weight of 370,000 to 500,000 and a crystal fusion heat of 5 to 25 mJ/mg; a rubber softener; and a polyolefin resin.

According to Patent Literature 1, there is a disclosure that a thermoplastic elastomer composition having remarkably improved heat resistance can be obtained while maintaining processability and flexibility.

In addition, Patent Literature 2 describes a seal material composed of butyl rubber as a flexible seal between two casing portions.

According to Patent Literature 2, there is a disclosure that when a seal material made of butyl rubber is used between two casing portions, the seal material can intrude into the minute rough surface recess of the joint surface at the time of joining the both casing portions together. In addition, there is a disclosure that the both casing portions are thereby joined together elastically and with a very large sealability.

In addition, Patent Literature 3 discloses a sealant composition including an isocyanate-terminated polyurethane prepolymer prepared by reacting a urethane diol, a polyol, and an excess of polyisocyanate, wherein the urethane dial is a reaction product of a polyisocyanate with an excess amount of a low molecular weight diol.

According to Patent Literature 3, there is a disclosure that after application, to adhere articles together, the hot melt composition can be solidified and cured to a material that has an irreversible solid form.

In the case of using the hot melt composition as a seal material disposed between the members, not only the above-mentioned performance but also the ability to maintain excellent airtightness even in a high temperature environment despite repeated opening and closing is required.

CITATION LIST

Patent Literature

Patent Literature 1: JP-A-2010-248328
Patent Literature 2: JP-A-2001-525985
Patent Literature 3: JP-A-2011-518239

SUMMARY OF INVENTION

It is an object of the present invention to provide a hot melt composition capable of suitably forming a seal material that can maintain excellent airtightness even in a high temperature environment even when repeatedly opened and closed. In addition, another object of the present invention is to provide a seal material including the hot melt composition, an electronic device including the seal material, and a lamp including the seal material.

One aspect of the present invention is a hot melt composition including a modified thermoplastic polymer having an alkoxysilyl group in a molecule, a softener, and a catalyst.

Another aspect of the present invention is a hot melt composition including a modified thermoplastic polymer modified with a silane coupling agent, a softener, and a catalyst.

Another aspect of the present invention is a hot melt composition production method including the steps of: mixing a thermoplastic polymer, a silane coupling agent, an organic peroxide, a softener, and a catalyst; and heating the mixture obtained in the mixing step while stirring, wherein the thermoplastic polymer is modified with the silane coupling agent.

These and other objects, features, and advantages of the present invention will become apparent from the following detailed description and the accompanying drawings.

DESCRIPTION OF EMBODIMENTS

According to the study by the inventors of the present invention, when the composition described in Patent Literature 1 was used as a seal material, there were some cases where airtightness could not be sufficiently maintained. This is thought to be due to the fact that a hydrogenated block copolymer such as a hydrogenated product of polystyrene-poly(butadiene/isoprene)-polystyrene triblock copolymer is contained in the composition described in Patent Literature 1. When a composition containing a hydrogenated block copolymer including such a polystyrene reaches a temperature exceeding 100° C. which is the glass transition temperature of polystyrene, it begins to soften. On the other hand, when a tackifier is added, the glass transition temperature of the composition increases, and at low temperatures, the seal material may peel off from the interface of the substrate, or in some cases, cracks may occur. For these reasons, it was sometimes difficult to maintain the airtightness sufficiently.

Further, according to the study by the inventors of the present invention, the seal material made of butyl rubber as described in Patent Literature 2 has insufficient heat resistance and, for example, when a seal material for an automobile member is used in a high temperature environment, the airtightness may be lowered due to thermal deterioration. Furthermore, since the seal material made of butyl rubber has a low cohesive force, the seal material is damaged in some cases because it sticks to the casing portion when the two casing portions are joined together with a seal material and then opened. From this, it was difficult to use the seal material made of butyl rubber when the seal material was repeatedly opened and closed.

Further, according to the study by the present inventors, when the composition described in Patent Literature 3 is used as a seal material, carbon dioxide is generated at the time of solidifying and curing into a material having an irreversible solid state, and bubbles called voids are generated in the seal material, so that the airtightness may be reduced.

From these facts, in the case where the compositions described in Patent Literatures 1 to 3 are used as a seal material disposed between members, even when repeatedly opened and closed, excellent airtightness cannot be maintained, and thus a suitable seal material could not be obtained. When the compositions described in Patent Literatures 1 to 3 are used as a seal material, for example, there are a case where it is impossible to open the space between the members via the seal material, a case where the seal material and the member are damaged when the space between the members via the seal material is opened, and a case where the members do not have excellent airtightness and the like. That is, when the compositions described in Patent Literatures 1 to 3 are used as a seal material, they are not capable of opening between members via a seal material or have no excellent airtightness.

As a result of various investigations, the present inventors have found that the above objects can be achieved by the following inventions of the present application.

Hereinafter, embodiments according to the present invention will be described, but the present invention is not limited thereto.

The hot melt composition according to the embodiment of the present invention includes a modified thermoplastic polymer, a softener, and a catalyst. The modified thermoplastic polymer is a modified thermoplastic polymer having an alkoxysilyl group in the molecule or a thermoplastic polymer modified with a silane coupling agent. The modified thermoplastic polymer modified with a silane coupling agent is a thermoplastic polymer having a hydrolyzable group in the molecule, and the hydrolyzable group is preferably an alkoxysilyl group. Also, the thermoplastic polymer reacts with the silane coupling agent to become a modified thermoplastic polymer. Accordingly, the hot melt composition containing the modified thermoplastic polymer modified with the silane coupling agent includes a thermoplastic polymer, a softener, a silane coupling agent, and a catalyst. Further, the hot melt composition is a composition that is in a solid shape (solid) at normal temperature, exhibits fluidity by heating, and becomes applicable.

The melt obtained by heating and melting such a hot melt composition can be suitably applied to a predetermined position. A seal material can be formed at a predetermined position of the member by applying such a melt, for example, between members required to have sealing properties. It is thought that at that time, the applied hot melt composition brings into contact with moisture in the air, and the hydrolyzable groups such as alkoxysilyl groups of the modified thermoplastic polymer react (crosslinking reaction) with each other, whereby the cured seal material will be excellent in airtightness. That is, it is thought that the following reaction occurs. When the hydrolyzable group is an alkoxysilyl group (—SiOR), first, an alkoxysilyl group (—SiOR) in a certain modified thermoplastic polymer and an alkoxysilyl group (—SiOR) in a modified thermoplastic polymer adjacent to the modified thermoplastic polymer are each hydrolyzed by moisture in the air, and an alcohol (ROH) is eliminated. Then, it is considered that at the same time of the elimination of the alcohol (ROH), a bond (—Si—O—Si—) is formed between the modified thermoplastic polymers by the reaction of the alkoxysilyl groups with each other. Thus, it is believed that the modified thermoplastic polymer is crosslinked in this way.

Since the seal material is crosslinked, it is considered that damage of the seal material due to opening and closing can be suppressed even when the members are repeatedly opened and closed even under high temperature environments.

From these facts, it is considered that the hot melt composition according to the present embodiment can be repeatedly opened and closed, so that a seal material capable of maintaining excellent airtightness can be suitably formed even under a high temperature environment.

First, as described above, the modified thermoplastic polymer used in the present embodiment is not particularly limited as long as it is a thermoplastic polymer having an alkoxysilyl group in the molecule or a thermoplastic polymer modified with a silane coupling agent.

In addition, the thermoplastic polymer before modification of the modified thermoplastic polymer is not particularly limited as long as it is a thermoplastic polymer used as a component constituting a hot melt composition such as a hot melt adhesive. Examples of the thermoplastic polymer include a thermoplastic polymer used as a base polymer which is a main component of a hot melt composition such as a hot melt adhesive. Specific examples of the thermoplastic polymer include thermoplastic polymers such as elastomer type, olefin type, ethylene vinyl acetate copolymer (EVA) type, polyester type, and polyamide type, including styrene block copolymer/acrylic block copolymer. Among these, elastomer type and olefin type thermoplastic polymers are preferred in the present embodiment, and elastomer type thermoplastic polymers are more preferred.

The elastomer type thermoplastic polymer is not particularly limited as long as it is used as an elastomer type thermoplastic polymer in a hot melt composition. Examples of the elastomer type thermoplastic polymer include a conjugated diene structural unit (conjugated diene unit).

Specific examples of the elastomer type thermoplastic polymer include a thermoplastic block copolymer which is a copolymer of a conjugated diene compound and a vinyl aromatic hydrocarbon. That is, such a thermoplastic block copolymer is preferably used as the thermoplastic polymer.

The conjugated diene compound is not particularly limited as long as it is a diolefin compound having at least one pair of conjugated double bonds. Specific examples of the conjugated diene compound include 1,3-butadiene, 2-methyl-1,3-butadiene (isoprene), 2,3-dimethyl-1,3-butadiene, 1,3-pentadiene, and 1,3-hexadiene, and the like.

The vinyl aromatic hydrocarbon is not particularly limited as long as it is an aromatic hydrocarbon having a vinyl group. Specific examples of the vinyl aromatic hydrocarbons include styrene, o-methylstyrene, p-methylstyrene, p-tert-butylstyrene, 1,3-dimethylstyrene, α-methylstyrene, vinylnaphthalene, vinyl anthracene, and the like.

The conjugated diene polymer may be a hydrogenated conjugated diene copolymer with hydrogenation or a non-hydrogenated conjugated diene copolymer without hydrogenation.

As the thermoplastic polymer, a thermoplastic block copolymer is preferred. Specific examples thereof include a styrene-butadiene block copolymer, a styrene-isoprene block copolymer, a hydrogenated styrene-butadiene block copolymer, a hydrogenated styrene-isoprene block copolymer, and the like. In addition, these copolymers include ABA type triblock copolymers. Examples of the styrene-butadiene block copolymer include styrene-butadiene-styrene block copolymer (SBS) and the like. Examples of the styrene-isoprene block copolymer include styrene-isoprene-styrene block copolymer (SIS) and the like. Examples of the hydrogenated styrene-butadiene block copolymer include styrene-ethylene-butylene-styrene block copolymer (SEBS) and the like. Examples of the hydrogenated styrene-isoprene block copolymer include styrene-ethylene-propylene-styrene block copolymer (SEPS) and the like.

The modified thermoplastic polymer used in the present embodiment is preferably a composition of a copolymer of a conjugated diene compound and a vinyl aromatic hydrocarbon. That is, as the thermoplastic polymer before modification of the modified thermoplastic polymer used in the present embodiment, the thermoplastic block copolymer is preferable. Further, as this thermoplastic polymer, a hydrogenated conjugated diene copolymer is more preferable. When such modified thermoplastic polymer is used, a seal material that can repeatedly be opened and closed and that can maintain more excellent airtightness even in a high temperature environment can be obtained by using the hot melt composition obtained.

The olefin type thermoplastic polymer is not particularly limited as long as it is used as an olefin type thermoplastic polymer in a hot melt adhesive. Examples of the olefin type thermoplastic polymer include polymers polymerized using olefins (alkenes) such as α-olefins as monomers. Specific examples of the olefin type thermoplastic polymer include homopolymers of propylene (propylene homopolymer), copolymers (copolymers, terpolymers) of propylene and other monomers, and the like. Examples of the copolymer include a copolymer of ethylene and propylene, such as ethylene-propylene copolymer, and more specifically, an ethylene-propylene copolymer obtained by polymerizing ethylene and propylene using a single site catalyst such as a metallocene catalyst or the like can be mentioned. Examples of the propylene homopolymer include a propylene homopolymer obtained by polymerizing propylene using a single site catalyst such as a metallocene catalyst and the like.

The EVA type thermoplastic polymer is not particularly limited as long as it is used as an EVA type thermoplastic polymer in a hot melt adhesive, and examples thereof include a copolymer synthesized from ethylene and vinyl acetate.

The polyester type thermoplastic polymer is not particularly limited as long as it is used as a polyester type thermoplastic polymer in a hot melt adhesive. As the polyester type thermoplastic polymer, for example, a polyester polymerized by using a dimer acid as a monomer can be mentioned.

The polyamide type thermoplastic polymer is not particularly limited as long as it is used as a polyamide type thermoplastic polymer in a hot melt adhesive, and examples thereof include polyamide and the like.

As the thermoplastic polymer, the thermoplastic polymer as described above may be used singly, or two or more of them may be used in combination.

The weight average molecular weight of the thermoplastic polymer varies depending on the type of the thermoplastic polymer, etc. and is not particularly limited, but it is preferably, for example, 10,000 to 500,000, and more preferably 50,000 to 300,000. If the molecular weight of the thermoplastic polymer is too small, the cohesive force tends to decrease and the stability over time tends to decrease. On the other hand, if the molecular weight of the thermoplastic polymer is too large, the melt viscosity tends to increase and the coatability tends to decrease. The weight average molecular weight here may be a weight average molecular weight measured by a general measurement method, and examples thereof include a weight average molecular weight measured by gel permeation chromatography (GPC) and the like.

The silane coupling agent is not particularly limited as long as it reacts with the thermoplastic polymer to become a modified thermoplastic polymer having a hydrolyzable group such as an alkoxysilyl group in the molecule. Examples of the silane coupling agent include those having in the molecule a hydrolyzable group such as an alkoxysilyl group and a reactive group capable of reacting with a resin or the like. Examples of the reactive group include a vinyl group, an epoxy group, a styryl group, an acryl group, a methacryl group, an amino group, a ureido group, a mercapto group, a sulfide group, and an isocyanate group.

Examples of the silane coupling agent include vinyltrimethoxysilane, vinyltriethoxysilane, vinyltriisopropoxysilane, vinyltris(isobutoxy)silane, vinylmethyldimethoxysilane, vinyltris(2-methoxyethoxy)silane, vinyltris(methylethylketoxime)silane, vinyltris(n-butylamino)silane, vinyltri(isopropenoxy)silane, vinyltriacetoxysilane, vinyltris(trimethylsiloxy)silane, vinyldimethoxymethylaminosilane, methacryloxypropyltrimethoxysilane, methacryloxypropyltriethoxysilane, methacryloxypropylmethyldimethoxysilane, methacryloxypropylmethyldiethoxysilane, acryloxypropyltrimethoxysilane, 3-glycidoxypropyltrimethoxysilane, 2-(3,4-epoxycyclohexyl)ethyltrimethoxysilane, 3-aminopropyltrimethoxysilane, 3-mercaptopropyltrimethoxysilane, 3-isocyanatopropyltrimethoxysilane, and the like.

As the silane coupling agent, the silane coupling agent as described above may be used singly or in combination of two or more thereof.

The modified thermoplastic polymer is not particularly limited as long as it is a thermoplastic polymer having an alkoxysilyl group in its molecule or a thermoplastic polymer modified with a silane coupling agent as described above. Examples of the thermoplastic polymer modified with the silane coupling agent include those obtained by reacting the thermoplastic polymer with the silane coupling agent. This reaction occurs in the coexistence of the thermoplastic polymer and the silane coupling agent, and may be carried out, for example, by stirring, heating or the like, or by adding an organic peroxide compound.

The organic peroxide compound used in the above reaction is not particularly limited as long as it can proceed the above reaction and can be appropriately selected from among known ones. Examples of the organic peroxide compound include di-tert-butyl peroxide, dicumyl peroxide, tert-butyl cumyl peroxide, benzoyl peroxide, dilauryl peroxide, cumene hydroperoxide, tert-butyl hydroperoxide, 1,1-bis(tert-butylperoxy)-3,5,5-trimethylcyclohexane, 2,5-dimethyl-2,5-di(tert-butylperoxy)hexane, 1,1-bis(tert-butylperoxy)-cyclohexane, cyclohexanone peroxide, tert-butyl peroxybenzoate, tert-butylperoxy isobutyrate, tert-butylperoxy-3,5,5-trimethyl hexanoate, tert-butylperoxy-2-ethyl hexanoate, tert-butylperoxy isopropyl carbonate, cumylperoxy octoate, and the like. Among these, dicumyl peroxide is preferred. As the organic peroxide compound, the organic peroxide compound exemplified above may be used singly or in combination of two or more thereof.

The addition amount of the organic peroxide compound is not particularly limited as long as it enables the above reaction to suitably proceed. The addition amount of the organic peroxide compound is preferably 0.1 to 5% by mass, more preferably 0.5 to 2% by mass, with respect to the total mass of the silane coupling agent and the thermoplastic polymer, that is, with respect to the mass of the modified thermoplastic polymer. When the addition amount of the organic peroxide compound is within the above range, the silane coupling agent can be suitably reacted with the thermoplastic polymer.

The softener used in the present embodiment is not particularly limited as long as it is a softener generally used for a hot melt composition such as a hot melt adhesive. As the softener, for example, a liquid or pasty hydrocarbon at ordinary temperature under ordinary pressure is exemplified. Specific examples of the softener include paraffinic oils (e.g. liquid paraffin, etc.), naphthenic oils, aromatic oils, liquid polypropylene, polybutene, polyisoprene, hydrogenated polyisoprene, hydrogenated polybutadiene, oils having an ester structure (e.g. vegetable oil, etc.), and the like. In addition, as the softener, each of the softeners exemplified above may be used singly or in combination of two or more of them.

The catalyst used in the present embodiment is not particularly limited as long as it is a catalyst capable of promoting the reaction between the hydrolyzable groups. Examples of the catalyst include organometallic compounds, carboxylic acids, carboxylic acid metal salts, organic sulfonic acids, acidic phosphoric acid esters, amine compounds, and the like. Examples of the organometallic compound include an organotin compound, an organotitanate compound, an organoaluminum compound, an organozirconium compound, an organoboron compound, and the like. Specific examples of the organometallic compound include dibutyltin diacetate, dibutyltin dilaurate, dibutyltin dimaleate, dioctyltin dilaurate, dioctyltin dimaleate, titanium acetylacetonate, and the like. In addition, each of the catalysts exemplified above may be used singly or in combination of two or more thereof.

Next, it is preferable that the hot melt composition according to the present embodiment further contains a tackifier. The tackifier used in the present embodiment is not particularly limited as long as it is a tackifier commonly used in hot melt compositions such as hot melt adhesives. Examples of the tackifier include a rosin type resin, a terpene type resin, a petroleum type resin, and the like.

Examples of the rosin type resin include natural rosin such as gum rosin, tall rosin, and wood rosin, disproportionated rosin, polymerized rosin, glycerin esters of these rosins, pentaerythritol esters of these rosins, and the like. In addition, the rosin type resin may be those in which each rosin type resin is not hydrogenated or hydrogenated, that is, hydrogenated products (hydrides) of the above rosin type resin.

Examples of the terpene type resins include terpene resins, hydrocarbon modified terpene resins, aromatic modified terpene resins, and phenol type modified terpene resins. In addition, these terpene type resins may be those in which each terpene type resin is not hydrogenated or hydrogenated, that is, hydrogenated products (hydrides) of the terpene type resins. Also, as the terpene type resin, preferred are aromatic modified terpene resin hydride, aromatic modified terpene resin, and terpene resin hydride, among which aromatic modified terpene resin hydride is more preferable.

Examples of the petroleum type resin include an aliphatic petroleum resin, an alicyclic petroleum resin, an aromatic petroleum resin, hydrogenated products thereof (hydrides), and the like. As the petroleum type resin hydride, preferred are aliphatic petroleum resin hydride, alicyclic petroleum resin hydride, and aromatic petroleum resin hydride.

As the tackifier, the above-mentioned tackifier may be used singly or in combination of two or more thereof.

In addition, in the hot melt composition, the content of each of the silane coupling agent, the thermoplastic polymer, the softener, and the catalyst is not particularly limited as long as it does not inhibit desired characteristics intended by the present invention. The respective contents are given, for example, in the following ranges.

The content of the silane coupling agent is preferably from 0.5 to 15% by mass, more preferably from 1 to 10% by mass, with respect to the total mass of the thermoplastic polymer and the softener. If the content of the silane coupling agent is too small, curing tends to be insufficient. Also, if the content of the silane coupling agent is too large, flexibility of the product obtained by curing the hot melt composition, for example, seal material, tends to decrease. Therefore, by setting the content of the silane coupling agent within the above range, a hot melt composition that forms a more suitable seal material can be obtained.

The content of the thermoplastic polymer is preferably from 5 to 50% by mas, more preferably from 10 to 40% by mass, with respect to the total mass of the thermoplastic polymer and the softener. That is, the content of the modified thermoplastic polymer is preferably from 5.5 to 65% by mass, more preferably from 11 to 50% by mass, with respect to the total mass of the thermoplastic polymer and the softener. When the content of the thermoplastic polymer is too small, the cohesive force tends to decrease. For this reason, when the seal material obtained is repeatedly opened and closed, it tends to be damaged. On the other hand, if the content of the thermoplastic polymer is too large, the viscosity of the hot melt composition tends to be too high, so that its suitable coating tends to become difficult. Therefore, by setting the content of the thermoplastic polymer within the above range, a hot melt composition that forms a more suitable seal material can be obtained.

The content of the softener is preferably from 50 to 95% by mass, more preferably from 60 to 90% by mass, with respect to the total mass of the thermoplastic polymer and the softener. If the content of the softener is too small, the effect as a softener (plasticizer), that is, the effect of improving coatability and enhancing flexibility cannot be sufficiently exerted, and the flexibility and the like of the resulting seal material tend to decrease. If the content of the softener is too large, the mechanical strength of the product obtained by curing the hot melt composition, for example, the seal material or the like, tends to decrease. Therefore, by setting the content of the softener within the above range, a hot melt composition that forms a more suitable seal material can be obtained.

The content of the catalyst is preferably from 0.01 to 20% by mass, more preferably from 0.5 to 10% by mass, with respect to the total mass of the thermoplastic polymer and the softener. If the content of the catalyst is too small, curing of the hot melt composition tends not to proceed suitably. If the content of the catalyst is too large, the pot life of the hot melt composition tends to be short, resulting in tending to decrease the storage stability. Therefore, by setting the content of the catalyst within the above range, a hot melt composition excellent in storage stability and capable of suitably producing a seal material can be obtained.

When the tackifier is contained, the content thereof is preferably 40% by mass or less with respect to the total mass of the thermoplastic polymer and the softener. Also, although a tackifier may not be contained, but when it is contained, the content of the tackifier is preferably 5% by mass or more in order to sufficiently exert its effect. That is, the content of the tackifier is preferably 5 to 40% by mass, more preferably 10 to 30% by mass. If the content of the tackifier is too small, there is a tendency that the effect containing the tackifier cannot be sufficiently exhibited. That is, there is a tendency that the pressure-sensitive adhesive strength and the like cannot be sufficiently improved. In addition, if the content of the tackifier is too large, the flexibility is reduced, and the low temperature characteristic tends to be impaired due to an increase in the glass transition temperature. Therefore, by including the tackifier in the above content, a hot melt composition capable of producing a more suitable seal material can be obtained.

The hot melt composition according to the present embodiment may contain other components than the silane coupling agent, the thermoplastic polymer, the softener, and the catalyst within the range not hindering the desired properties intended by the present invention. Specifically, the hot melt composition may contain additives such as an antioxidant, a heat stabilizer, a light stabilizer, an ultraviolet absorber, a filler, a surfactant, a coupling agent, a colorant, an antistatic agent, a flame retardant, a wax, and a plasticizer.

Examples of the antioxidant include a phenol type antioxidant and an organic sulfur type antioxidant. Examples of the phenol type antioxidant include 2,6-di-tert-butyl-4-methylphenol, n-octadecyl-3-(3,5-di-tert-butyl-4-hydroxyphenyl)propionate, 2-(tert-butyl-6-(3-tert-butyl-2-hydroxy-5-methylbenzyl)-4-methylphenyl acrylate, tetrakis [methylene-3-(3,5-di-tert-butyl-4-hydroxyphenyl) propionate]methane, and the like. Examples of the organic sulfur type antioxidant include dilauryl-3,3'-thiodipropionate, dimyristyl-3,3'-thiodipropionate, distearyl-3,3'-thiodipropionate, pentaerythrityl tetrakis(3-laurylthiopropionate), and the like. As to these antioxidants, the above-mentioned antioxidants may be used singly or in combination of two or more thereof.

The wax is not particularly limited as long as it is a wax contained in a hot melt adhesive. Examples of waxes include synthetic waxes, petroleum waxes, and natural waxes. Examples of synthetic waxes include polyolefin waxes such as Fischer-Tropsch wax, polyethylene wax, and polypropylene wax. Examples of the petroleum wax include paraffin wax, microcrystalline wax, and petrolatum. As natural waxes, for example, montan wax, mokuro (Japan tallow), carnauba wax, bees wax, castor wax, and the like can be mentioned. These waxes exemplified above may be used singly or in combination of two or more thereof.

Also, it is preferable that the hot melt composition has a glass transition temperature of $-20°$ C. or less. The lower the glass transition temperature, the better the tendency is, but the limit is about $-80°$ C. That is, the glass transition temperature of the hot melt composition is preferably $-80$ to $-20°$ C., more preferably $-60$ to $-20°$ C., even more preferably $-50$ to $-30°$ C. If the glass transition temperature is too high, a product obtained by curing the hot melt composition, for example, a seal material or the like may peel off from the surface of the base material in a low temperature environment, or in some cases, cracks may occur. Accordingly, when the glass transition temperature of the hot melt composition is within the above range, a hot melt composition that forms a seal material having better air tightness can be obtained. This is considered to be due to the fact that peeling of the seal material and occurrence of cracks in a low temperature environment can be suppressed by adjusting the composition so that the glass transition temperature falls within the above range. Therefore, it is thought that a seal material having better airtightness can be obtained.

The glass transition temperature can be measured by a general measurement method, and can be measured, for example, by dynamic viscoelasticity measurement (rheometer).

In addition, in the hot melt composition, the melt viscosity at $180°$ C. is preferably 100,000 mPa·s or less. The lower the melt viscosity, the better the tendency is, but the limit is about 1,000 mPa·s. That is, the melt viscosity of the hot melt composition at $180°$ C. is preferably 1,000 to 100,000 mPa·s, more preferably 2,000 to 50,000 mPa·s. If the melt viscosity is too high, it tends to be difficult to apply the coating suitably. In addition, even if the melt viscosity is too low, it tends to be difficult to apply the coating suitably. Therefore, by setting the melt viscosity within the above range, a hot melt composition that forms a more suitable seal material can be obtained. That is, it is possible to more suitably form a seal material that can be repeatedly opened and closed and can maintain excellent airtightness even under a high temperature environment. This means that by adjusting the composition so that the melt viscosity at $180°$ C. falls within the above range, the melt obtained by heating and melting the hot melt composition is preferably applied to a predetermined position of the member. Thus, it is considered that the seal material can be formed at a predetermined position.

The melt viscosity at $180°$ C. can be measured by a general measurement method. As the viscometer, for example, a Brookfield viscometer can be used.

The hot melt composition production method according to the present embodiment is not particularly limited as long as it is a production method capable of producing the hot melt composition having the above-mentioned constitution. As a hot melt composition production method, for example, a method of heating and melting components constituting the hot melt composition, followed by stirring and kneading, can be mentioned. By doing so, it is possible to obtain a hot melt composition having high dispersibility of components constituting the hot melt composition. Examples of a device for realizing this method include a stirring kneader, a roll, a Banbury mixer, a kneader, an extruder, etc., all these apparatuses being equipped with a heating device.

The hot melt composition production method according to the present embodiment is specifically a method including the steps of mixing a thermoplastic polymer, a silane coupling agent, an organic peroxide, a softener, and a catalyst and heating the mixture obtained in the mixing step while stirring. Then, the thermoplastic polymer is modified with the silane coupling agent. By doing so, it is possible to produce a hot melt composition which can be repeatedly opened and closed and can suitably form a seal material capable of maintaining excellent airtightness even in a high temperature environment. This is thought to be due to the following.

By the mixing step and the heating step, the thermoplastic polymer is modified with the silane coupling agent. As a result, the thermoplastic polymer becomes a modified thermoplastic polymer modified with the silane coupling agent. The modified thermoplastic polymer has a hydrolyzable group derived from the silane coupling agent, such as an alkoxysilyl group. It is believed that this hydrolyzable group crosslinks the modified thermoplastic polymer as described above. By this crosslinking, it is considered that the hot melt composition capable of forming a seal material which can be repeatedly opened and closed and can maintain excellent airtightness can be suitably formed even under a high temperature environment. Therefore, it is considered that the production method described above is capable of producing a hot melt composition that forms a seal material which can be repeatedly opened and closed and can suitably maintaining excellent airtightness even under high temperature environment.

In addition, the hot melt composition according to the present embodiment can be used for various applications such as a hot melt adhesive. Among them, it is preferable to use the hot melt composition as a seal material. Specifically, first, the hot melt composition is melted by heating. Then, the molten hot melt composition is applied to a position where a seal material should be disposed between the members. The hot melt composition is allowed to cool and solidify by leaving it in a state of being applied between the members or the like. A cured product of the hot melt composition thus obtained is served as a seal material. That is, the seal material according to the present embodiment is made of a hot melt composition. Since such a seal material is made of the above-mentioned hot melt composition, it can be repeatedly opened and closed and can maintain excellent airtightness even under high temperature environment.

Further, the seal material according to the present embodiment can be used, for example, as a seal material for an electronic device, a seal material for a lamp such as a lighting device for an automobile, a seal material for an exterior equipment of an automobile, or the like. Examples of exterior equipment of automobiles include emblems and ornaments.

Figure 1:
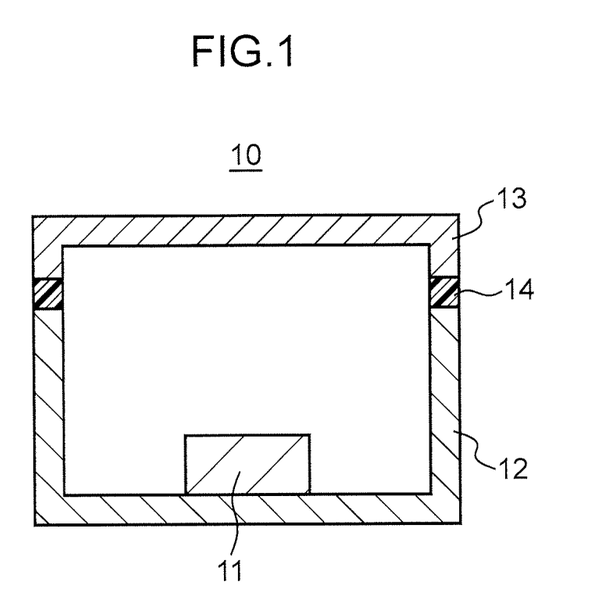
FIG. 1 is a schematic sectional view showing an electronic device according to the present embodiment.

Examples of the electronic device including the seal material according to the present embodiment are as follows. As shown in FIG. 1, an electronic device 10 includes an electronic circuit component 11, a container 12 for accommodating the electronic circuit component 11, a lid 13 for covering the container 12, a seal material 14 interposed between the container 12 and the lid 13. The seal material 14 is a seal material that can be repeatedly opened and closed and can maintain excellent airtightness even under a high temperature environment as mentioned above. By doing so, it is possible to obtain the electronic device 10 including the electronic circuit component 11 accommodated in the container 12 and the lid 13 with high airtightness. In addition, the electronic device 10 can open the lid while suppressing damage to the container 12, the lid 13, and the seal material 14 while having high airtightness. FIG. 1 is a schematic sectional view showing an electronic device according to the present embodiment.

Figure 2:
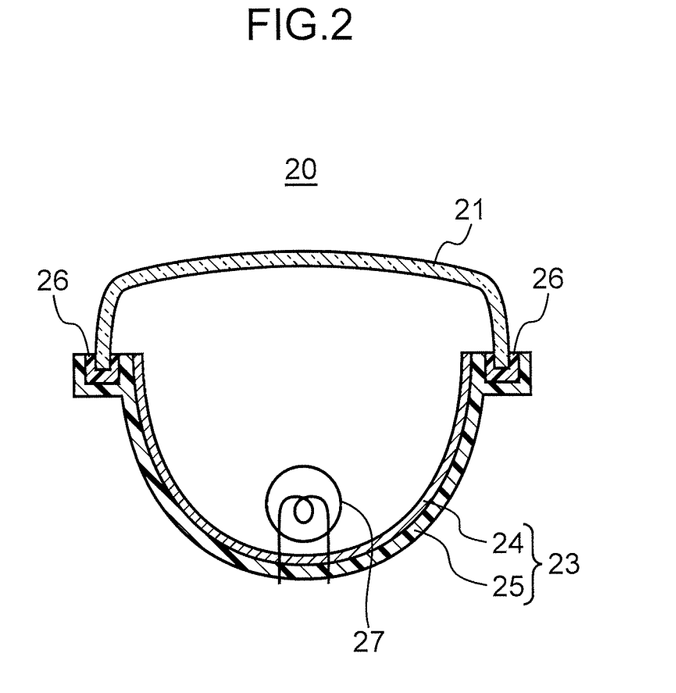
FIG. 2 is a schematic sectional view showing a lamp according to the present embodiment.

Examples of the lamp including the seal material according to the present embodiment include the followings. Specifically, as shown in FIG. 2, a lamp 20 includes a light source 27, a housing 23 for holding the light source 27, a lens 21 for covering the housing 23, and a seal material 26 interposed between the lens 21 and the housing 23. The housing 23 includes a reflector 24 for reflecting the light emitted from the light source 27 toward the lens 21 side, and a holding portion 25 for holding the light source 27 and the reflector 24 on the outside thereof. Further, the lens 21 is not particularly limited as long as it is a member capable of transmitting the light emitted from the light source 27. Then, the seal material 26 is the above-mentioned seal material, that is, a seal material which can be repeatedly opened and closed and can maintain excellent airtightness even under a high temperature environment. By doing so, the lamp 20 including the light source 27 held in the housing 23 which is covered with the lens 21 with high airtightness can be obtained. In addition, the lamp 20 is capable of opening the lens while suppressing damage to the lens 21, the housing 23, and the seal material 26 as well as while keeping high airtightness. Further, in this lamp, since the seal material can maintain excellent airtightness even in a high temperature environment, it can also be used for vehicles such as automobiles. FIG. 2 is a schematic sectional view showing the lamp according to the present embodiment.

As described above, the present specification discloses technologies of various aspects, among which main technologies are summarized below.

One aspect of the present invention is a hot melt composition including a modified thermoplastic polymer having an alkoxysilyl group in a molecule; a softener; and a catalyst.

According to such a configuration, a seal material capable of maintaining excellent airtightness even when repeatedly opened and closed, and a hot melt composition that can suitably form a seal material capable of maintaining excellent airtightness even when repeatedly opened and closed can be provided. This is thought to be due to the following.

For example, in the case where this hot melt composition is applied between the members on which the seal material is disposed, the applied hot melt composition is brought into contact with moisture in the air, so that it is thought that the alkoxysilyl groups of the modified thermoplastic polymer react with each other and are then cured. That is, it is considered that a crosslinking reaction occurs. Through this crosslinking reaction, it is considered that a seal material excellent in airtightness even under a high temperature environment can be obtained.

Further, since the seal material is crosslinked, it is considered that damage of the seal material due to opening and closing can be suppressed even when the members are repeatedly opened and closed. In addition, this seal material is flexible even after the reaction, and even when the members are repeatedly opened and closed, the members are not damaged, so that the members can be reused.

Further, since the melt obtained by heating and melting the hot melt composition can be suitably applied to a predetermined position of the member, it is thought that the seal material can be formed at a predetermined position.

Therefore, it is considered that such a hot melt composition can form a seal material that can be repeatedly opened and closed and can maintain excellent airtightness even under a high temperature environment.

Another aspect of the present invention is a hot melt composition including a modified thermoplastic polymer modified with a silane coupling agent; a softener; and a catalyst.

According to such a configuration, it is possible to provide a seal material that has excellent airtightness even after being repeatedly opened and closed, and a hot melt composition capable of forming a seal material that can maintain excellent airtightness even when repeatedly opened and closed. This means that since the modified thermoplastic polymer modified with the silane coupling agent has a hydrolyzable group such as an alkoxysilyl group in the molecule, it is considered that this hot melt composition brings into contact with the moisture in the air to cause a crosslinking reaction as described above.

It is also considered that such a hot melt composition can also form a seal material at a predetermined position as described above.

Therefore, it is considered that such a hot melt composition can suitably form a seal material that can be repeatedly opened and closed and can maintain excellent airtightness even under a high temperature environment.

In the hot melt composition, it is preferable that the modified thermoplastic polymer has an alkoxysilyl group in the molecule.

According to such a configuration, a seal material that can maintain more excellent airtightness can be obtained even when it is repeatedly opened and closed. That is, a seal material that can be repeatedly opened and closed and can maintain more excellent airtightness even in a high temperature environment can be obtained. This is considered to be due to the fact that since the modified thermoplastic polymer has an alkoxysilyl group as a hydrolyzable group, a reaction caused by bringing into contact with moisture in the air, that is, a crosslinking reaction, produces an alcohol. If the generated product is an alcohol, voids are less likely to be generated than carbon dioxide, so it is considered that reduction in airtightness can be suppressed. Therefore, a seal material that can be repeatedly opened and closed and can maintain more excellent airtightness even in a high temperature environment can be obtained.

In the hot melt composition, it is preferable for the silane coupling agent to have at least one kind selected from the group consisting of a vinyl group, an epoxy group, a styryl group, an acryl group, a methacryl group, an amino group, a ureido group, a mercapto group, a sulfide group and an isocyanate group.

According to such a configuration, it is possible to obtain a seal material that can be repeatedly opened and closed and can maintain more excellent airtightness even under a high temperature environment. This is thought to be due to the following. Since the silane coupling agent can suitably modify the thermoplastic polymer, it is considered that the above-mentioned modified thermoplastic polymer will preferably have a hydrolyzable group such as an alkoxysilyl group in the molecule. Therefore, it is considered that the curing reaction by the hydrolyzable group proceeds favorably. Thus, by adopting such a configuration, it is believed that a seal material which is more excellent in airtightness and can maintain excellent airtightness more is formed.

In the hot melt composition, the modified thermoplastic polymer is preferably a modified product of a copolymer of a conjugated diene compound and a vinyl aromatic hydrocarbon. In addition, it is more preferable that the copolymer is at least one kind selected from the group consisting of a styrene-butadiene block copolymer, a styrene-isoprene block copolymer, a hydrogenated styrene-butadiene block copolymer, and a hydrogenated styrene-isoprene block copolymer.

According to such a configuration, it is possible to obtain a seal material that can be repeatedly opened and closed and can maintain more excellent airtightness even under a high temperature environment.

In the hot melt composition, the content of the thermoplastic polymer is preferably 5 to 50% by mass with respect to the total mass of the thermoplastic polymer and the softener. The content of the softener is preferably 50 to 95% by mass with respect to the total mass of the thermoplastic polymer and the softener.

According to such a configuration, a seal material that can be repeatedly opened and closed and can maintain more excellent airtightness much more even under a high temperature environment can be obtained.

Further, it is preferable that the hot melt composition further contains a tackifier. It is more preferable that the content of the tackifier is 40% by mass or less with respect to the total mass of the thermoplastic polymer and the softener.

According to such a configuration, it is possible to provide a hot melt composition that forms a seal material which can be repeatedly opened and closed, can maintain excellent airtightness even under a high temperature environment, and has improved pressure-sensitive adhesiveness.

In the hot melt composition, the glass transition temperature is preferably from −60° C. to −20° C.

According to such a configuration, it is possible to obtain a seal material having better airtightness.

This is considered to be due to the fact that peeling of the seal material and occurrence of cracks in a low temperature environment can be suppressed by adjusting the composition so that the glass transition temperature falls within the above range. Therefore, it is thought that a seal material having better airtightness can be obtained.

Further, in the hot melt composition, the melt viscosity at 180° C. is preferably from 1,000 to 100,000 mPa·s.

According to such a configuration, it is possible to suitably form a seal material that can be repeatedly opened and closed and can maintain more excellent airtightness even under a high temperature environment.

This is considered to be due to the fact that the melt obtained by heating and melting the hot melt composition can be suitably applied to a predetermined position of the member by adjusting the composition so that the melt viscosity at 180° C. falls within the above-mentioned range. Thus, it is considered that the seal material can be formed at a predetermined position.

Another aspect of the present invention is a hot melt composition production method including the steps of mixing a thermoplastic polymer, a silane coupling agent, an organic peroxide, a softener, and a catalyst, and heating the mixture obtained in the mixing step while heating, wherein the thermoplastic polymer is modified with the silane coupling agent.

According to such a configuration, it is possible to produce a hot melt composition capable of suitably forming a seal material that can maintain excellent airtightness even when repeatedly opened and closed. That is, it is possible to produce a hot melt composition that can suitably form a seal material which can be repeatedly opened and closed and can maintain more excellent airtightness even under a high temperature environment. This is thought to be due to the following.

By the mixing step and the heating step, the thermoplastic polymer is modified with the silane coupling agent. As a result, the thermoplastic polymer is converted into a modified thermoplastic polymer modified with the silane coupling agent. The modified thermoplastic polymer has a hydrolyzable group derived from the silane coupling agent, such as an alkoxysilyl group. It is believed that the modified thermoplastic polymer is crosslinked with this hydrolyzable group as described above. By this crosslinking, it is considered that the hot melt composition can suitably form a seal material which can be repeatedly opened and closed and can maintain excellent airtightness even under a high temperature environment. Therefore, it is considered that the above-mentioned production method can produce a hot melt composition capable of forming a seal material which can be repeatedly opened and closed and can maintain excellent airtightness even under high temperature environment.

Another aspect of the present invention is a seal material including the hot melt composition.

According to such a configuration, it is possible to provide a seal material that can be repeatedly opened and closed and can maintain excellent airtightness even under a high temperature environment.

Another aspect of the present invention is an electronic device including an electronic circuit component, a container for housing the electronic circuit component, a lid for covering the container, and a seal material interposed between the container and the lid, wherein the seal material is the above-mentioned seal material.

According to such a configuration, it is possible to provide an electronic device having electronic circuit parts accommodated in a container and a lid with high airtightness. In addition, since the seal material is a seal material that can be repeatedly opened and closed and can maintain excellent airtightness even under high temperature environment, the electronic device sealed with such a seal material can open the lid while having high airtightness and suppressing damage to the lid, the container, and the seal material.

Another aspect of the present invention is a lamp including a light source, a housing for holding the light source, a lens for covering the housing, and a seal material interposed between the lens and the housing, wherein the seal material is the above-mentioned lamp.

According to such a configuration, it is possible to provide a lamp including a light source held in a housing covered with a lens with high airtightness. In addition, since the seal material is a seal material that can be repeatedly opened and closed and can maintain excellent airtightness even under a high temperature environment, the lamp has high airtightness and can open the lens while suppressing damages of the lens, the housing, and the seal material.

According to the present invention, it is possible to provide a hot melt composition capable of suitably forming a seal material that can maintain excellent airtightness even when repeatedly opened and closed. Further, according to the present invention, there are provided a seal material including the hot melt composition, an electronic device including the seal material, and a lamp including the seal material.

Hereinafter, the present invention will be described more specifically with reference to examples, but the scope of the present invention is not limited thereto.

EXAMPLES

First, each component constituting a hot melt composition will be described.

Silane Coupling Agent

Methacryloxypropyltrimethoxysilane (OFS-6030 manufactured by Dow Corning Toray Co., Ltd.)
Methacryloxypropyltriethoxysilane (KBE-503 manufactured by Shin-Etsu Chemical Co., Ltd.)

Thermoplastic Polymer

Thermoplastic polymer 1: styrene-ethylene-butylene-styrene block copolymer (SEBS) (SEPTON 8006, weight average molecular weight Mw: 200,000, manufactured by Kuraray Co., Ltd.)
Thermoplastic polymer 2: SEBS (SEPTON 8004, weight average molecular weight Mw: 100,000, manufactured by Kuraray Co., Ltd.)
Thermoplastic polymer 3: SEBS (SEPTON 8007L, weight average molecular weight Mw: 70,000, manufactured by Kuraray Co., Ltd.)
Thermoplastic polymer 4: styrene-ethylene-propylene-styrene block copolymer (SEPS) (SEPTON 2002, weight average molecular weight Mw: 100,000, manufactured by Kuraray Co., Ltd.)
Thermoplastic polymer 5: SEBS (KRATON 1652 MU, weight average molecular weight Mw: 70,000, manufactured by Kraton Polymers)

Modified Thermoplastic Polymer

Modified thermoplastic polymer: silane-modified amorphous polyalphaolefin (silane modified APAO) (Vestoplast 206, modified thermoplastic polymer having an alkoxysilyl group in the molecule, manufactured by Evonik Resource Efficiency GmbH)

Softener

Softener 1: paraffinic oil (process oil, Diana Fresia S32 manufactured by Idemitsu Kosan Co., Ltd.)
Softener 2: paraffinic oil (polybutene, polybutene 10N manufactured by NOF CORPORATION)

Organic Peroxide Compound (Organic Peroxide)

Dicumyl peroxide (PERCUMYL D manufactured by NOF CORPORATION)

Catalyst

Dibutyltin dilaurate (manufactured by Tokyo Chemical Industry Co., Ltd.)

Tackifier

Aromatic modified terpene resin hydride (CLEARON K4100 manufactured by Yasuhara Chemical Co., Ltd.)

Aliphatic petroleum resin (WINGTACK 95 manufactured by Cray Valley USA, LLC)

Antioxidant

Tetrakis[methylene-3-(3,5-di-tert-butyl-4-hydroxyphenyl)propionate]methane (IRGANOX 1010 manufactured by BASF Japan Ltd.)

Hot Melt Composition Production Method

Each of the above components was charged into a stirring kneader so as to obtain the blending amounts (composition: parts by mass) shown in the following Tables 1 and 2 and sufficiently melted by kneading it in a state heated to 150 to 190° C. At that time, the hot melt composition was kneaded as far as possible until the homogeneity of the hot melt composition was increased. By doing so, a hot melt composition was produced.

Evaluation

Coatability

The melt viscosity of the hot melt composition before curing at 180° C. was measured as follows. Specifically, in accordance with the measuring method described in JIS K 6682, the viscosity of the melt of the hot melt composition melted at 180° C. was measured with a Brookfield viscometer. This viscosity is the melt viscosity of the hot melt composition before curing at 180° C.

When the melt viscosity is 50,000 mPa·s or less, the coatability was evaluated as "⊙"; when the melt viscosity is higher than 50,000 mPa·s and 100,000 mPa·s or less, the coatability was evaluated as "○"; and when the melt viscosity is higher 100,000 mPa·s, the coatability was evaluated as "x".

Flexibility

G' of the hot melt composition after curing at 23° C. was measured as follows. Specifically, first, a sample having a diameter of 8 mm was cut out from the hot melt composition having a thickness of 1 mm (a cured product of the hot melt composition) after curing. Dynamic viscoelasticity of the obtained sample was measured using a dynamic viscoelasticity measuring device (ARES rheometer manufactured by TA Instruments). As measurement conditions, dynamic viscoelasticity at −50° C. to 180° C. was measured with a flat plate, frequency 1 Hz, strain 0.05%. By this measurement, G' (Pa) at 23° C. of the cured product of the hot melt composition was measured.

When G' at 23° C. is $10^4$ Pa or more and $10^6$ Pa or less, the flexibility was evaluated as "○", when G' at 23° C. is higher than $10^3$ Pa and lower than $10^4$ Pa, the flexibility was evaluated as "Δ", and when G' at 23° C. is $10^3$ Pa or less or higher than $10^6$ Pa, the flexibility was evaluated as "x".

High Temperature Characteristic

G' at 150° C. of the hot melt composition after curing was measured as follows. Specifically, G' (Pa) at 150° C. of the cured product of the hot melt composition was measured by the above dynamic viscoelasticity measurement.

When G' at 150° C. is $10^4$ Pa or more, the high temperature characteristic was evaluated as "⊙"; when G' at 150° C. is higher than $10^3$ Pa and lower than $10^4$ Pa, the high temperature characteristic was evaluated as "Δ", and when G' at 150° C. is $10^3$ Pa or less, the high temperature characteristic was evaluated as "x". Also, if the shape could not be maintained at 150° C., the high temperature characteristic was evaluated as "unmeasurable".

Low Temperature Characteristics

Tg of the hot melt composition after curing was measured as follows. Specifically, tan δ of the cured product of the hot melt composition was measured by the above dynamic viscoelasticity measurement. The peak temperature of tan δ in the dynamic viscoelasticity measurement was measured as Tg.

When Tg is −40° C. or less, the low temperature characteristic was evaluated as "⊙", when Tg is higher than −40° C. and lower than −20° C., the low temperature characteristic was evaluated as "○"; and when Tg is −20° C. or lower, the low temperature characteristic was evaluated as "x".

Easiness of Reuse

In the case of using the hot melt composition as a seal material, it is required that the sealing function can be maintained without breaking (damaging) the members even when the member and the member which are sealed via the seal material are opened. Moreover, this is required not only in an ordinary temperature environment but also in a high temperature environment. Further, these characteristics include the matters that are required in consideration of the convenience of the site of use, i.e. repeated opening and closing of the members. From these facts, the easiness of reuse was evaluated as follows.

First, the repairability was examined. As a jig for evaluation, a jig capable of arranging a seal material between two members was used. A hot melt composition was applied between the two members of the evaluation jig to form a seal material. Thereafter, the two members were tightened, and then the seal material and the member when opened were visually confirmed. The case where coatability, flexibility, temperature characteristics such as high temperature characteristics and low temperature characteristics were good, and the cleaning work was not required in reusing the member because the seal material and the member were not damaged after the evaluation of the repairability and the seal material could be easily peeled from the member, the easiness of reuse was evaluated as "○". In addition, when the temperature characteristics such as the high temperature characteristics and the low temperature characteristics were inferior, or the seal material and the member after the evaluation of the repairability were not so damaged as to be unusable, but they were damaged, the easiness of reuse was evaluated as "Δ". The case where the seal material and the member after the evaluation of the repairability were damaged to an unusable extent or the seal material could not be easily peeled from the member, the easiness of reuse was evaluated as "x".

TABLE 1

| COMPOSITION (PART BY MASS) | | | EXAMPLE | | | | | | | | | | COMPARATIVE EXAMPLE | | | |
|---|---|---|---|---|---|---|---|---|---|---|---|---|---|---|---|---|
| | | | 1 | 2 | 3 | 4 | 5 | 6 | 7 | 8 | 9 | 1 | 2 | 3 | 4 |
| SILANE COUPLING AGENT | METHACRYLOXYPROPYL-TRIMETHOXYSILANE | | 5 | 5 | 5 | 10 | 15 | 1 | — | 5 | 5 | — | — | 5 | — |
| | METHACRYLOXYPROPYL-TRIETHOXYSILANE | | — | — | — | — | — | — | 5 | — | — | — | — | — | — |
| THERMOPLASTIC POLYMER | 1 SEBS | Mw: 200,000 | 10 | 10 | 5 | 10 | 10 | 10 | 10 | 7 | 4 | 10 | 5 | 4 | — |
| | 2 SEBS | Mw: 100,000 | — | 5 | — | 5 | 5 | 5 | 5 | — | — | — | — | — | — |
| | 3 SEBS | Mw: 70,000 | — | — | 35 | — | — | — | — | — | — | — | 35 | — | 26 |
| | 4 SEBS | Mw: 70,000 | — | — | — | — | — | — | — | — | — | — | — | — | 20 |
| SOFTENER 1 | | | 90 | 85 | 60 | 85 | 85 | 85 | 85 | 93 | 96 | 90 | 60 | 96 | — |
| ORGANIC PEROXIDE COMPOUND | DICUMYL PEROXIDE | | 0.5 | 0.5 | 0.5 | 1 | 1.5 | 0.2 | 0.5 | 0.5 | 0.5 | — | — | 0.5 | — |
| CATALYST | DIBUTYLTIN DILAURATE | | 0.05 | 0.05 | 0.05 | 0.05 | 0.05 | 0.05 | 0.05 | 0.05 | 0.05 | — | — | — | — |
| TACKIFIER | ALIPHATIC PETROLEUM ETHER | | — | — | — | — | — | — | — | — | — | — | — | — | 54 |
| EVALUATION | COATABILITY | MELT VISCOSITY AT 180° C. (mPa·s) | 22600 | 64700 | 89300 | 33600 | 20400 | 99300 | 59100 | 1800 | 1300 | 137000 | 226000 | 1440 | 8488 |
| | | EVALUATION | ◎ | ○ | ○ | ◎ | ◎ | ○ | ○ | ◎ | ◎ | X | X | ◎ | ◎ |
| | FLEXIBILITY | G' AT 23° C. (Pa) | 10590 | 17993 | 174540 | 14518 | 15820 | 18437 | 17703 | 2590.9 | 1608 | 4854 | 224790 | 661.25 | 674000 |
| | | EVALUATION | ◎ | ◎ | ○ | ◎ | ◎ | ◎ | ○ | △ | △ | △ | ○ | X | ○ |
| | HIGH TEMPERATURE CHARACTERISTICS | G' AT 150° C. (Pa) | 13359 | 13312 | 12473 | 10028 | 14088 | 11849 | 12768 | 6548.9 | 5530.2 | UN-MEASUR-ABLE | 9723.2 | UN-MEASUR-ABLE | UN-MEASUR-ABLE |
| | LOW TEMPERATURE CHARACTERISTICS | Tg (° C.) | ≤−50 | ≤−50 | ≤−50 | ≤−50 | ≤−50 | ≤−50 | ≤−50 | ≤−50 | ≤−50 | ≤−50 | ≤−50 | ≤−50 | −1 |
| | | EVALUATION | ◎ | ◎ | ◎ | ◎ | ◎ | ◎ | ◎ | ◎ | △ | ◎ | ◎ | ◎ | X |
| | EASINESS OF REUSE | | ○ | ○ | ○ | ○ | ○ | ○ | ○ | △ | △ | X | X | X | X |

TABLE 2

| | | | | | EXAMPLE | | | | |
|---|---|---|---|---|---|---|---|---|---|
| | | | | 10 | 11 | 12 | 13 | 14 | 15 |
| COMPOSITION (PART BY MASS) | SILANE COUPLING AGENT | METHACRYLOXYPROPYL-TRIMETHOXYSILANE | | — | 5 | 5 | 5 | 5 | 5 |
| | THERMOPLASTIC POLYMER | 1 SEBS | Mw: 200,000 | 5 | — | — | 10 | 10 | 10 |
| | | 2 SEBS | Mw: 100,000 | 10 | — | — | 5 | — | 5 |
| | | 3 SEBS | Mw: 70,000 | — | — | 20 | — | — | — |
| | | 4 SEPS | Mw: 100,000 | — | 40 | — | — | — | — |
| | MODIFIED THERMOPLASTIC POLYMER | SILANE-MODIFIED APAO | | 25 | — | — | — | — | — |
| | SOFTENER 1 | | | 60 | 60 | — | 75 | 60 | 84 |
| | SOFTENER 2 | | | — | — | 80 | — | — | — |
| | ORGANIC PEROXIDE COMPOUND | DICUMYL PEROXIDE | | — | 0.5 | 0.5 | 0.5 | 0.5 | 0.5 |
| | CATALYST | DIBUTYLTIN DILAURATE | | 0.05 | 0.05 | 0.05 | 0.05 | 0.05 | 0.05 |
| | TACKIFIER | AROMATIC MODIFIED TERPENE RESIN HYDRIDE | | — | — | — | 10 | 30 | — |
| | ANTIOXIDANT | | | — | — | — | — | — | 1 |
| EVALUATION | COATABILITY | MELT VISCOSITY AT 180° C. (mPa·s) | | 93500 | 95600 | 10500 | 73100 | 20800 | 63300 |
| | | EVALUATION | | ○ | ○ | ◎ | ○ | ◎ | ○ |
| | FLEXIBILITY | G' AT 23° C. (Pa) | | 104340 | 170280 | 43160 | 18535 | 22593 | 17828 |
| | | EVALUATION | | ○ | ○ | ○ | ○ | ○ | ○ |
| | HIGH TEMPERATURE CHARACTERISITICS | G' AT 150° C. (Pa) | | 12596 | 15028 | 6673 | 14116 | 10873 | 13042 |
| | | EVALUATION | | ○ | ○ | △ | ○ | ○ | ○ |
| | LOW TEMPERATURE CHARACTERISITICS | Tg (° C.) | | ≤−50 | −48 | ≤−50 | −46 | −36 | ≤−50 |
| | | EVALUATION | | ◎ | ◎ | ◎ | ◎ | ○ | ◎ |
| | EASINESS OF REUSE | | | ○ | ○ | ○ | ○ | ○ | ○ |

From Table 1 and Table 2, it was found that the easiness of reuse in the case of the hot melt composition containing a silane coupling agent, a thermoplastic polymer, a softener, and a catalyst (Examples 1 to 9, 11 to 15) is higher as compared with the case without containing a silane coupling agent (Comparative Examples 1 and 2) and the case without containing a catalyst (Comparative Example 3). This is presumably because the silane coupling agent modifies the thermoplastic polymer, so that the hot melt composition contains a modified thermoplastic polymer modified with the silane coupling agent. Further, in the case of containing a modified thermoplastic polymer having an alkoxysilyl group in the molecule (Example 10), the possibility of reuse was also high. Specifically, the hot melt compositions according to Examples 1 to 15 had a melt viscosity that was easy to apply and were excellent in flexibility and temperature characteristics such as high temperature characteristics and low temperature characteristics. In addition, the seal materials made of these hot melt compositions were hardly damaged in the members and the seal material even if the member and the member were separated from each other after the seal material is interposed between the members. Further, in the case of the hot melt composition including a thermoplastic polymer, a softener, and a tackifier (Comparative Example 4), it was found that when the easiness of reuse was evaluated, the members were damaged, and the easiness of reuse was low.

In addition, the hot melt compositions according to Examples 1 to 15 were hard to generate voids even when they were cured. Specifically, under the following conditions, occurrence of voids could not be confirmed. First, a hot melt composition was applied in a bead form having a width of 5 mm. The applied hot melt composition was allowed to stand at a temperature of 40° C. and a humidity of 60% RH for 72 hours and then left at 60° C. for 24 hours. The hot melt composition allowed to stand was visually confirmed. This visually confirmed hot melt composition was cured, and in this visual observation, the presence or absence of voids generated at the time of curing was confirmed. As a result, occurrence of voids could not be confirmed in the cured products of the hot melt compositions of Examples 1 to 15 under the above conditions.

The present application is based on Japanese Patent Application No. 2015-238140 filed on Dec. 7, 2015, the contents of which being incorporated in the present application.

Although the present invention has been suitably and adequately described above by way of the embodiment while referring to the drawings in order to represent the present invention, it should be appreciated that a person skilled in the art can easily modify and/or improve the above embodiment. Accordingly, unless modified or improved embodiment of the person skilled in the art departs from the scope of the right as claimed, such modified or improved embodiment should be understood to be embraced by the scope as claimed.

INDUSTRIAL APPLICABILITY

According to the present invention, there is provided a hot melt composition capable of suitably forming a seal material that can maintain excellent airtightness even when repeatedly opened and closed. Further, according to the present invention, there are provided a seal material including the hot melt composition, an electronic device including the seal material, and a lamp including the seal material.

The invention claimed is:

1. A hot melt composition comprising a modified thermoplastic polymer having an alkoxysilyl group in a molecule, a softener, and a catalyst.

2. A hot melt composition comprising a modified thermoplastic polymer modified with a silane coupling agent, a softener, and a catalyst.

3. The hot melt composition according to claim 2, wherein the modified thermoplastic polymer has an alkoxysilyl group in a molecule.

4. The hot melt composition according to claim 2, wherein the silane coupling agent has at least one kind selected from the group consisting of a vinyl group, an epoxy group, a styryl group, an acryl group, a methacryl group, an amino group, a ureido group, a mercapto group, a sulfide group, and an isocyanate group.

5. The hot melt composition according to claim 1, wherein the modified thermoplastic polymer is a modified product of a copolymer of a conjugated diene compound and a vinyl aromatic hydrocarbon.

6. The hot melt composition according to claim 5, wherein the copolymer is at least one kind selected from the group consisting of a styrene-butadiene block copolymer, a styrene-isoprene block copolymer, a hydrogenated styrene-butadiene block copolymer, and a hydrogenated styrene-isoprene block copolymer.

7. The hot melt composition according to claim 1, wherein a content of the thermoplastic polymer is from 5 to 50% by mass with respect to a total mass of the thermoplastic polymer and the softener, and a content of the softener is from 50 to 95% by mass with respect to the total mass of the thermoplastic polymer and the softener.

8. The hot melt composition according to claim 1, further comprising a tackifier.

9. The hot melt composition according to claim 8, wherein a content of the tackifier is 40% by mass or less with respect to the total mass of the thermoplastic polymer and the softener.

10. The hot melt composition according to claim 1, wherein a glass transition temperature is from −60° C. to −20° C.

11. The hot melt composition according to claim 1, wherein a melt viscosity at 180° C. is from 1,000 to 100,000 mPa·s.

12. A hot melt composition production method comprising the steps of:
    mixing a thermoplastic polymer, a silane coupling agent, an organic peroxide, a softener, and a catalyst; and
    heating the mixture obtained in the mixing step while stirring,
    wherein the thermoplastic polymer is modified with the silane coupling agent.

13. A seal material comprising the hot melt composition as set forth in claim 1.

14. An electronic device comprising an electronic circuit component, a container for accommodating the electronic circuit component, a lid for covering the container, and a seal material interposed between the container and the lid,
    wherein the seal material is a seal material as set forth in claim 13.

15. A lamp comprising a light source, a housing for holding the light source, a lens for covering the housing, and a seal material interposed between the lens and the housing,
    wherein the seal material is a seal material as set forth in claim 13.

* * * * *